United States Patent
Anazawa et al.

(10) Patent No.: US 7,298,658 B2
(45) Date of Patent: Nov. 20, 2007

(54) SEMICONDUCTOR MEMORY DEVICE USING ROW REDUNDANCY AND I/O REDUNDANCY SCHEME BASED ON A PRESET ORDER AND A DEFECT ORDER

(75) Inventors: Kazuhito Anazawa, Kanagawa (JP); Eiji Kitazawa, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 18 days.

(21) Appl. No.: 11/408,995

(22) Filed: Apr. 24, 2006

(65) Prior Publication Data

US 2006/0239090 A1    Oct. 26, 2006

(30) Foreign Application Priority Data

Apr. 25, 2005   (JP)   ............................. 2005-126455

(51) Int. Cl.
  *G11C 29/00*   (2006.01)
(52) U.S. Cl. .................. 365/200; 365/201; 365/225.7; 365/189.07; 365/189.05; 365/236; 365/230.02; 714/711; 714/710
(58) Field of Classification Search ............... 365/201, 365/200, 225.7, 189.07, 189.05, 236, 230.02, 365/230.03; 714/711, 710, 718
  See application file for complete search history.

(56) References Cited

U.S. PATENT DOCUMENTS 4,942,556 A * 7/1990 Sasaki et al. ............... 365/200
5,377,146 A * 12/1994 Reddy et al. ............... 365/200
5,764,878 A   6/1998 Kablanian ...................... 714/7
5,920,515 A * 7/1999 Shaik et al. ................. 365/200
5,987,632 A * 11/1999 Irrinki et al. ............... 714/711
6,388,929 B1 * 5/2002 Shimano et al. ............. 365/201
6,574,757 B1   6/2003 Park et al. ................... 714/710
6,643,180 B2 * 11/2003 Ikehashi et al. ....... 365/185.22
6,819,596 B2 * 11/2004 Ikehashi et al. ....... 365/185.22
7,171,592 B2 * 1/2007 Togashi et al. ............... 714/54

FOREIGN PATENT DOCUMENTS

JP        9-311824      12/1997
JP        2001-216797   8/2001

* cited by examiner

*Primary Examiner*—Andrew Q. Tran
(74) *Attorney, Agent, or Firm*—McGinn IP Law Group, PLLC (57) ABSTRACT

To reduce the area relating to location of redundant elements for relieving defects of a memory. A memory device has row address and input/output data as two dimensional redundancy parameters for relieving defects of an embedded memory 30. It comprises a built-in self-test circuit 10 for testing defects of the embedded memory 30, a redundant element location operator 20 for determining which redundant element replaces a defect based on a preset order and according to the order in which defects are detected by the self-test circuit 10, and a row redundancy unit 31 and an I/O redundancy unit 32 for replacing the defects in the embedded memory according to the determined order. The redundant element location operator 20 determines the priority axis according to the preset order and according to the order in which the defects are detected, and holds redundant element location information.

4 Claims, 6 Drawing Sheets

SEMICONDUCTOR MEMORY DEVICE USING ROW REDUNDANCY AND I/O REDUNDANCY SCHEME BASED ON A PRESET ORDER AND A DEFECT ORDER

FIELD OF THE INVENTION

The present invention relates to a semiconductor memory device and particularly to a semiconductor memory device having a self-repair function for an embedded memory.

BACKGROUND OF THE INVENTION

On a system LSI, a DRAM as a large capacity memory storing data is embedded with a logic circuit. A random access operation as fast as a SRAM is demanded from such an embedded DRAM. Further, since a memory cell consists of one transistor and one capacitor (one transistor plus one capacitor structure) as in the case of a generic DRAM, a bit failure may occur (the manufacturing variation of the contact resistance is a major cause). Therefore, a test as fast as that for the SRAM and a redundancy structure with as many rows and columns as that of the generic DRAM in order to relieve bit failures are needed for the embedded DRAM and so is a technique that tests and applies the both efficiently. In such a technique, testing a memory circuit embedded in a device with a built-in self-test circuit (BIST) without using a tester device (that performs DC/AC test on devices) and replacement by a redundant memory cell is performed by cutting the electric fuse according to the result of the self test.

As an example of a memory having such a redundancy structure, an integrated circuit semiconductor device comprising a built-in self-repair circuit (BISR) for an embedded memory and a method for repairing the memory are disclosed in Patent Document 1. This integrated circuit semiconductor device comprises an embedded memory including multiple row and column redundancies, a built-in self-test circuit (BIST) for detecting faulty memory cells of the memory, and a built-in self-repair circuit for storing information relating to the detected faulty memory cells by dividing information into row information and column information, determining repair methods of repairing the faulty memory cells base on the row information and column information, and generating repaired addresses in the embedded memory. Further, the priority axis is selected according to the number of faulty cells in a two dimensional redundancy parameter. In other words, whether the faulty cells are replaced with redundant memory cells by column or row is determined according to whether multiple faulty cells exist in particular memory cell column or memory cell row.

Further, an on chip self-repair system comprising a row repair circuit for repairing row memory lines having at least one defect and an I/O repair circuit, connected to the row repair circuit, for repairing I/O memory blocks having at least one defect is disclosed in Patent Document 2. And an arbitrator, connected between the row repair circuit and the I/O repair circuit, for implementing a priority scheme is further provided.

[Patent Document 1]

Japanese Patent Kokai Publication No. JP-P2001-216797A (FIG. 1)

[Patent Document 2]

Japanese Patent Kokai Publication No. JP-A09-311824 (FIG. 1)

The disclosure of the above Patent Documents 1 and 2 are herein incorporated by reference thereto.

SUMMARY OF THE DISCLOSURE

The redundant element location operator in Patent Document 1 uses row address and column address as two dimensional redundancy parameters. However, it is preferable that the embedded DRAM comprise a small number of column addresses and a large number of data inputs/outputs in order to obtain a high data transfer bandwidth. When the column address is used as a redundancy parameter, it creates a problem that the redundant memory cell region increases. For instance, in a structure having 8 column addresses and 128 data inputs/outputs, the number of bit lines that the redundant memory cell region has is ⅛ of the total bit lines because 128 bit lines are needed for every redundant address. This means a 12.5 percent increase in chip size. Therefore, it is more common to use input/output data (I/O) as a redundancy parameter instead of column address.

For the reason stated above, it is effective to have a row repair circuit and an I/O repair circuit such as the ones described in Patent Document 2. In this case, a latch circuit that latches at least the number of redundant row addresses plus 1 is needed for every I/O even though it is not mentioned in Paten Document 2. The reason for this is because it is necessary to have it store the state in which all redundant row addresses have been used up (i.e., to make the I/O concerned "redundant MUST") in order for the device to decide to use a redundant row or redundant I/O. For instance, in the case of a memory having 2 redundant row addresses and 128 I/Os, two flip-flops for storing three defects are needed to decide that a redundant I/O must be used (i.e., to make the I/O redundant MUST), and a total of 256 (2×128) flip-flops must be provided. This creates the problem that the chip area increases. Thus there is much to be desired in the art.

According to an aspect of the present invention, there is provided a semiconductor memory device having a row redundancy unit and an I/O redundancy unit as two dimensional redundancy units for relieving defects of an embedded memory, the row redundancy unit including redundant memory cell groups that replace memory cell rows addressed by row addresses, and the I/O redundancy unit including redundant memory cell groups that replace memory cell groups provided for every input/output data, wherein the memory device comprises:

a built-in self-test circuit that tests an embedded memory, a redundant element location operator that selects a redundant memory cell group from the row redundancy unit and the I/O redundancy unit based on a preset order and according to the order in which defects are detected by the self-test circuit, and a redundancy replacement unit that replaces defects in the embedded memory with the redundant memory cell group selected by the redundant element location operator.

According to a second aspect, the redundant element location operator comprises a latch circuit that stores the address of the defect replaced in the embedded memory and an address overlap determining circuit that detects a coincidence between a defect address detected by the self-test circuit and the address of the defect stored in the latch circuit, and the latch circuit latches the defect address detected when no coincidence is detected.

According to a third aspect, the redundant element location operator further comprises a shift register circuit that shifts a predetermined signal and outputs a pulse signal for the latch circuit to latch the defect address every time the coincidence detection indicates that there is no overlap.

According to a fourth aspect, the redundant element location operator comprises a counter circuit that counts the number of times that the coincidence detection indicates that there is no overlap, and a decoder circuit that receives and decodes outputs as many as the number of bits of the counter circuit and outputs a pulse signal for the latch circuit to latch the defect address.

The meritorious effects of the present invention are summarized as follows.

According to the present invention, the circuit scale of the redundant element location operator can be reduced by selecting a redundant element based on a preset order and according to the order in which defects are detected.

PREFERRED EMBODIMENTS OF THE INVENTION

Figure 1:
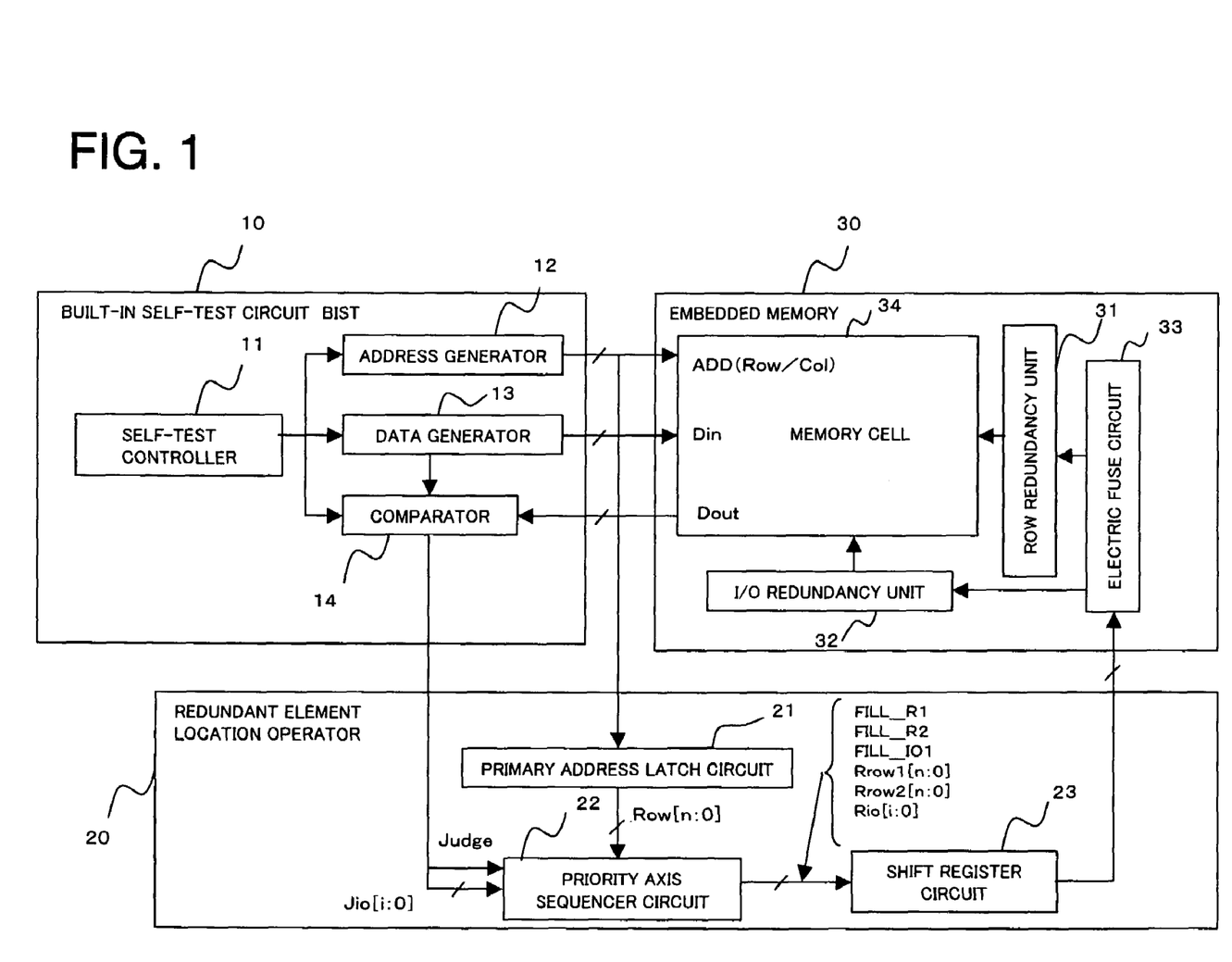
FIG. 1 is a block diagram illustrating the structure of a semiconductor memory device relating to a first embodiment of the present invention.

A semiconductor memory device relating to an embodiment of the present invention has row address and input/output data as two dimensional redundancy parameters for relieving defects of an embedded (built-in) memory (30 in FIG. 1). This semiconductor memory device comprises a built-in self-test circuit (10 in FIG. 1) that tests whether or not the embedded memory is defective, a redundant element location operator (20 in FIG. 1) that determines which redundant element replaces the defect based on a preset order and according to the order of defects detected by the self-test circuit, and a row redundancy unit (31 in FIG. 1) and an I/O redundancy unit (32 in FIG. 1) that perform replacement of the defect in the embedded memory corresponding to the selected redundant element. The redundant element location operator (20 in FIG. 1) determines the order in which the defects of row addresses and input/output data are to be relieved (determines the priority axis) according to a preset order and corresponding to the order in which the defects are detected, and holds redundant element location information. An electric fuse circuit (33 in FIG. 1) programs relief information for relieving the defects based on this redundant element location information. The row redundancy unit (31 in FIG. 1) and the I/O redundancy unit (32 in FIG. 1) relieve and repair the corresponding bit failures in the embedded memory (30 in FIG. 1) according to the programmed relief information.

In the semiconductor memory device structured as above, a high-speed operation is easily achieved and a high-speed function test at the same operation frequency as that of the embedded memory is possible since the redundant element location operator simply operates according to the order in which defects are detected. Further, the hold circuit for holding the logical information of the redundant element location is small scale and the pellet area (the area of the entire DRAM circuit including the memory cells) will not increase. Hereinafter, embodiments of the present invention will be described in detail with reference to the drawings.

Embodiment 1

FIG. 1 is a block diagram illustrating the structure of a semiconductor memory device relating to a first embodiment of the present invention. In FIG. 1, the semiconductor memory device comprises a built-in self-test circuit (BIST) 10, the redundant element location operator 20, and the embedded memory 30.

The self-test circuit 10 comprises a self-test controller 11, an address generator 12, a data generator 13, and a comparator 14, and has functions of generating test patterns for the embedded (built-in) memory 30 and of comparing the test results. The structure of the self-test circuit 10 is almost the same as that of the conventional example, however, the comparator 14 outputs a total comparison result signal Judge and an individual I/O comparison result signal Jio[i,0] to the redundant element location operator 20 to test and repair the embedded memory with I/O redundancy. The total comparison result signal Judge shows the test result of the BIST indicating whether or not memory cells selected by an address outputted by the address generator 12 include any faulty cell. Further, the individual I/O comparison result signal Jio[i,0] individually indicates whether or not there is an error for each I/O. Note that, in the descriptions of signal lines below, [i,0] means that they exist corresponding to the number of the I/Os, and [n,0] means that they exist in multiplicity corresponding to the number of the addresses.

The redundant element location operator 20 comprises a primary address latch circuit 21, a priority axis sequencer circuit 22, and a shift register circuit 23. The primary address latch circuit 21 temporarily latches the address signal outputted to the embedded memory 30 by the address generator 12 and outputs it as an output signal Row [n,0] to the priority axis sequencer circuit 22. The priority axis sequencer circuit 22 receives the output signal Row [n,0] of the primary address latch circuit 21 and the total comparison result signal Judge and the individual I/O comparison result signal Jio[i,0] outputted by the comparator 14, determines the priority axis according to a preset order and corresponding to the order in which defects are detected, and outputs output signals FILL_R1, FILL_R2, FILL_IO1, Rrow1[n,0], Rrow2[n,0], and Rio[i,0] to the shift register circuit 23 in order to latch row address and I/Os for redundancy replacement. The shift register circuit 23 receives output signals FILL_R1, FILL_R2, FILL_IO1, Rrow1[n,0], Rrow2[n,0], and Rio[i,0] from the priority axis sequencer circuit 22, and holds data and adjusts the timing in order to output signals Rrow1[n,0], Rrow2[n,0], and Rio[i,0] as row address information and I/O information to the electric fuse circuit 33.

The embedded memory 30 is an embedded RAM and comprises a row redundancy unit 31, an I/O redundancy unit 32, an electric fuse circuit 33, and a memory cell group 34. The row redundancy unit 31 and the I/O redundancy unit 32 replace and relieve bit failures in the memory cell group 34 according to the information outputted by the electric fuse circuit 33. The electric fuse circuit 33 programs the information on relief by cutting the electric fuse based on the row address information and the I/O information outputted by the redundant element location operator 20 in order to relieve and repair the corresponding bit failures. Note that a built-in self-repair circuit (BISR) performing logical repair through software is used in the conventional art, however, the electrical fuse circuit (efuse circuit) repairing physically and electrically is used here. Needless to say, the software means may be used as a repairing means.

Figure 2:
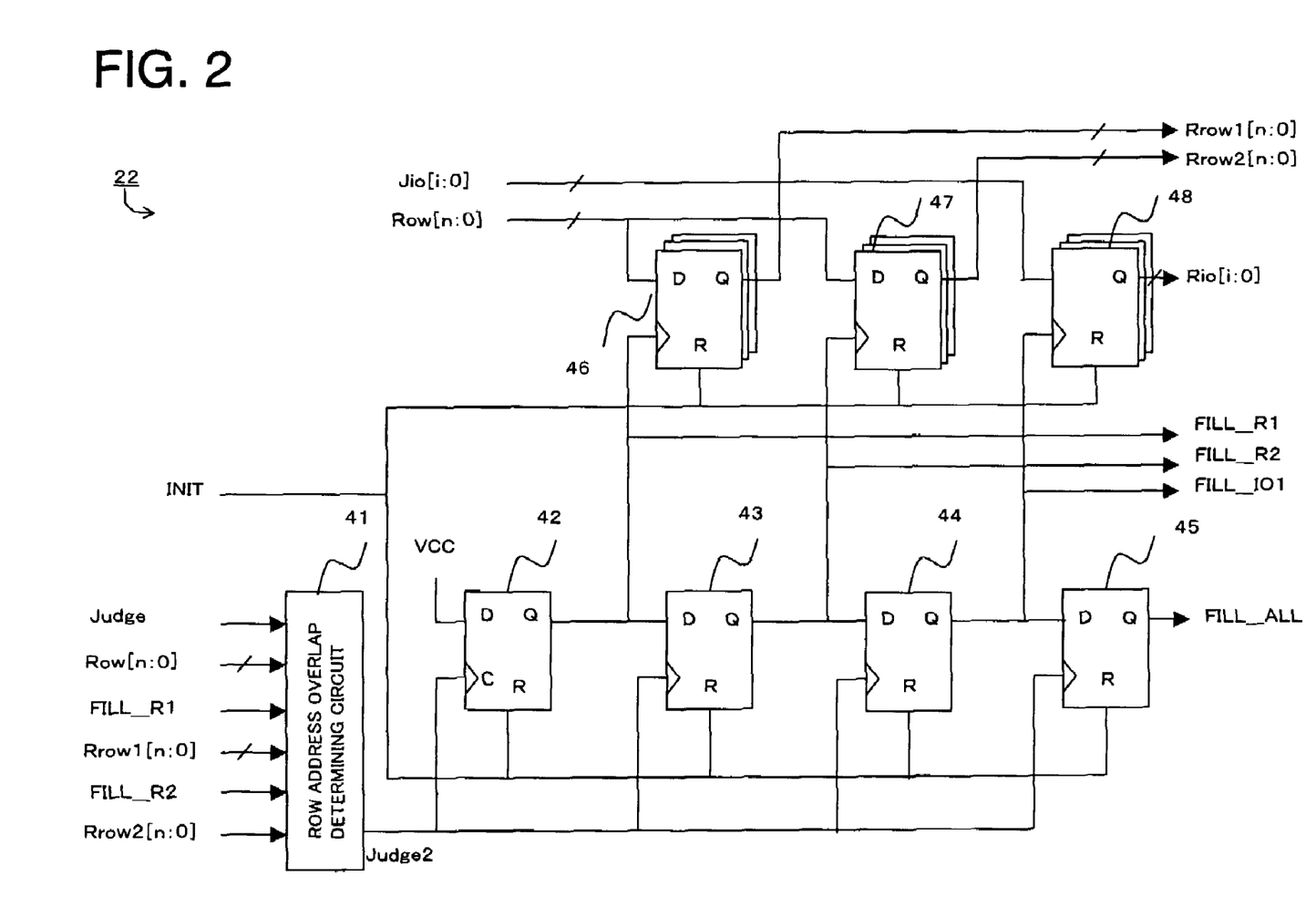
FIG. 2 is a block diagram illustrating the structure of a priority axis sequencer.

FIG. 2 is a block diagram illustrating the structure of the priority axis sequencer of the semiconductor memory device relating to the first embodiment of the present invention. The priority axis sequencer circuit 22 comprises a row address overlap determining circuit 41 and flip-flop circuits 42 to 48. Note that repairing means for an embedded memory having 2 redundant rows and 1 redundant I/O is shown in this example. Further, each of the flip-flop circuits 42 to 48 exist in plurality corresponding to the numbers of the addresses and I/Os.

The row address overlap determining circuit 41 receives the signals Judge, FILL_R1, FILL_R2, Rrow[n,0], Rrow1[n,0], and Rrow2[n,0] and determines whether or not a failing row address has already been used as a redundant row address, i.e., whether or not the address indicated by Rrow1[n,0] or Rrow2[n,0] and the address indicated by Row[n,0] overlap. And if it determines that they don't overlap, it outputs a signal Judge2 as a clock signal to a respective clock input terminal C of the flip-flop circuits 42 to 45.

Every time the signal Judge2 becomes high level, the flip-flop circuits 42 to 45 shift the high level (VCC) in order. Outputs of the flip-flop circuits 42 to 44 are respectively outputted as the signals FILL_R1 and FILL_R2 indicating that the row redundancy is confirmed, and FILL_IO1 indicating that the I/O redundancy is confirmed, and are respectively fed to clock inputs of the flip-flop circuits 46 to 48. When the signals FILL_R1, FILL_R2, and FILL_IO1 become high level, the flip-flop circuits 46 to 48 respectively latch the signals Row[n,0], Row[n,0], and Jio[i,0], and output them as the signals Rrow1[n,0], Rrow2[n,0], and Rio[i,0] to the shift register circuit 23.

The flip-flop circuits 46 to 48 respectively become the latch circuit for a first faulty row address, the latch circuit for a second faulty row address, and the latch circuit for a faulty I/O.

Figure 3:
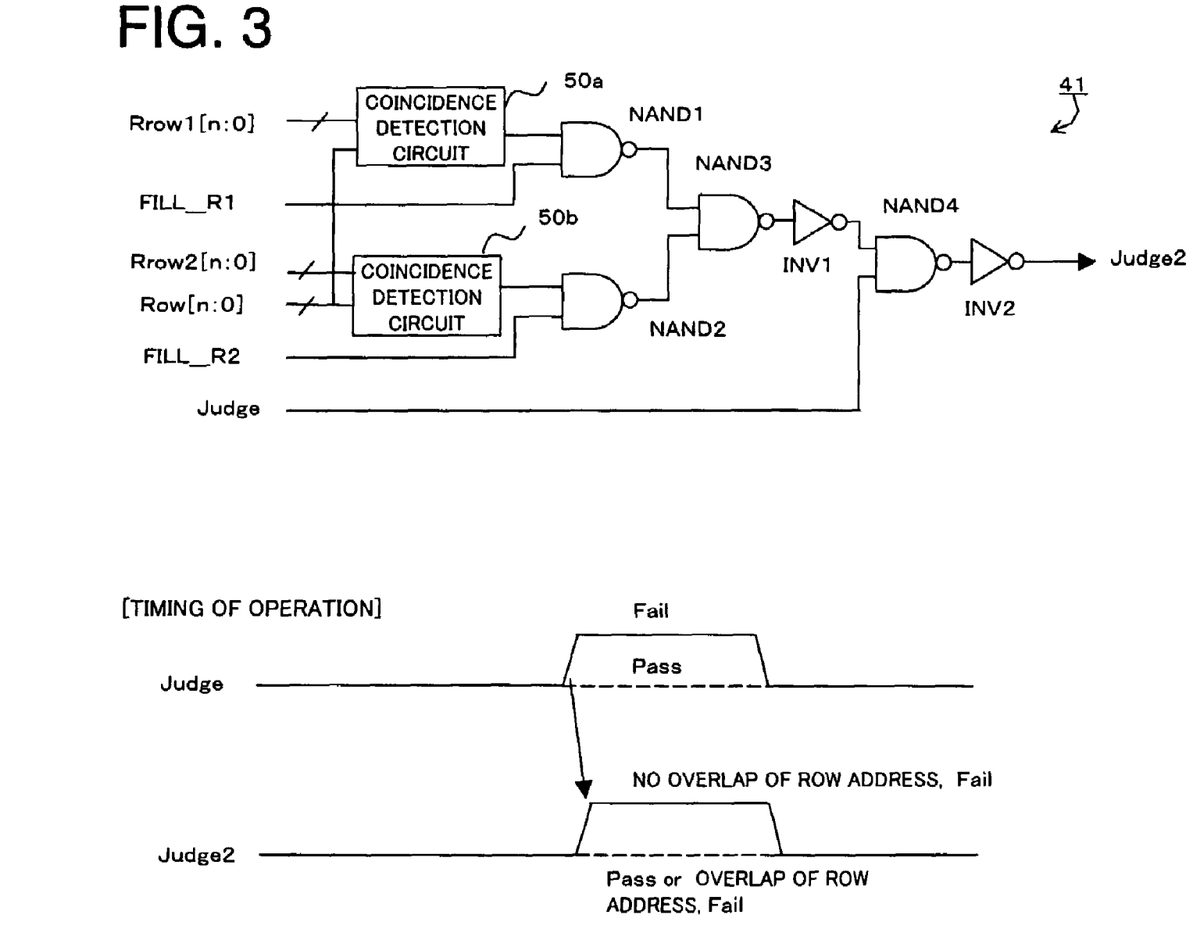
FIG. 3 is a block diagram illustrating the structure of a row address overlap determining circuit.

FIG. 3 is a block diagram illustrating the structure of the row address overlap determining circuit 41. The row address overlap determining circuit 41 comprises coincidence detection circuits 50a and 50b, NAND circuits NAND1, NAND2, NAND3, and NAND4, and inverter circuits INV1 and INV2. The coincidence detection circuit 50a outputs a high level when all the bits of the signals Rrow1[n,0] and Row[n,0] that it receives coincide. Further, the coincidence detection circuit 50b outputs a high level when all the bits of the signals Rrow2[n,0] and Row[n,0] that it receives coincide. The NAND circuit NAND1 outputs a low level when the coincidence detection circuit 50a detects a coincidence and the signal FILL_R1 is at a high level, and the NAND circuit NAND2 outputs a low level when the coincidence detection circuit 50b detects a coincidence (high) and the signal FILL_R2 is at a high level. The NAND circuit NAND3 receives the output of the NAND circuit NAND1, and its output is connected to one end of an input of the NAND circuit NAND4 via the inverter circuit INV1. The signal Judge is fed to the other end of the input of the NAND circuit NAND4 and it is outputted as the signal Judge2 via the inverter circuit INV1.

The row address overlap determining circuit 41 as described above outputs the signal Judge2 at a high level, indicating a "fail" and that there is no row address overlap, in case the signal Judge becomes high level indicating a "fail" and there is no row address overlap. Further, in case the signal Judge is at a low level indicating a "pass" or in case there is a row address overlap, the signal Judge2 outputs a low level indicating a "pass" or that there is a row address overlap and a "fail".

Figure 4:
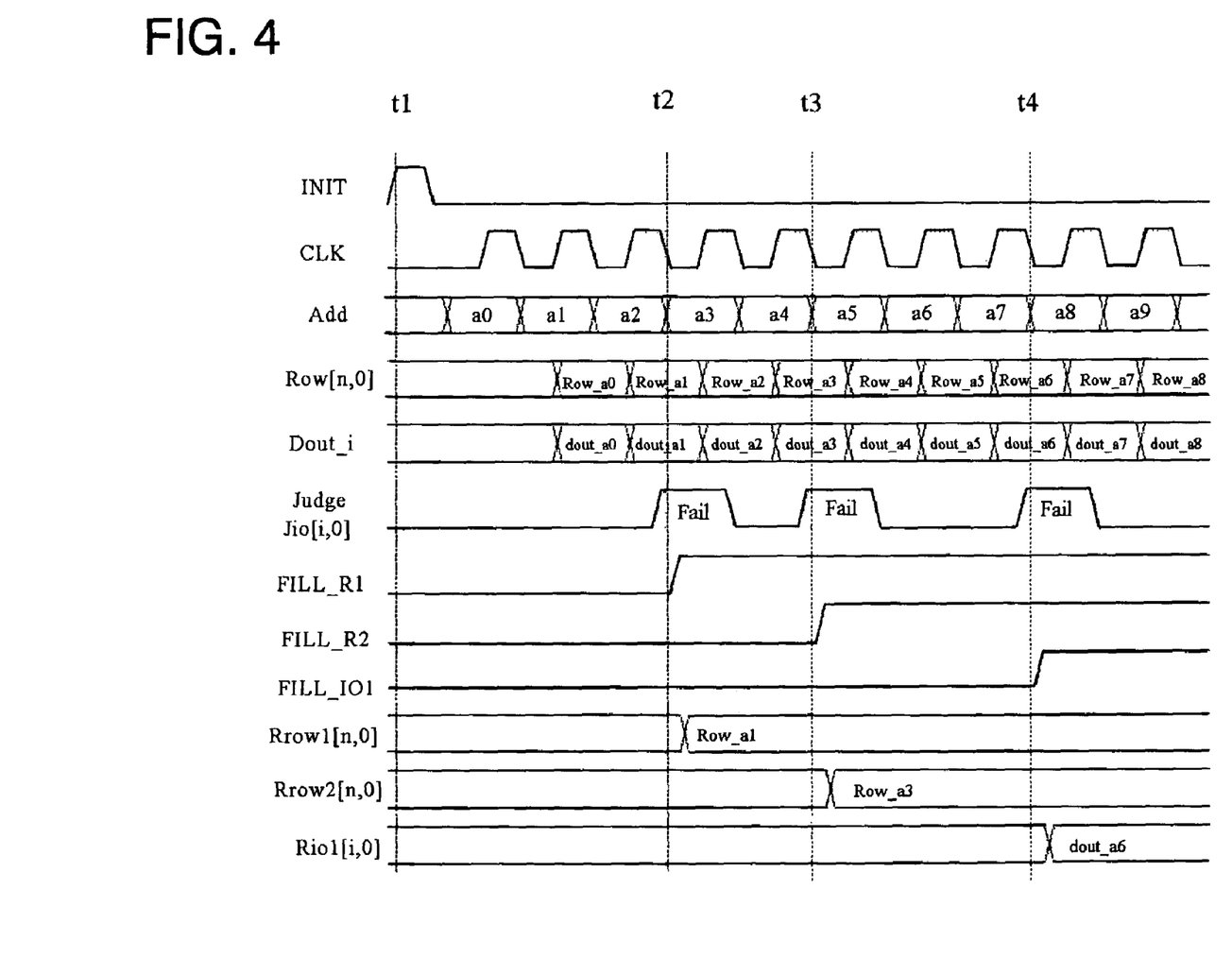
FIG. 4 is a timing chart illustrating the operation of the semiconductor memory device.

Next, the operation of the redundant element location operator 20 will be described with reference to the drawing. FIG. 4 is a timing chart illustrating the operation of the semiconductor memory device relating to the first embodiment of the present invention. At time t1, when an initialize signal INIT becomes high level, the flip-flop circuits 42 to 48 are initialized and each output of the flip-flop circuits become low level. Then, when a clock signal CLK is supplied, the self-test circuit 10 starts to operate and test the embedded memory 30. The address generator 12 outputs row/column addresses Add(a0, a1, a2 . . . ) to the embedded memory 30 in order, the row addresses are latched by the primary address latch circuit 21, and the signal Row[n,0] is outputted. Meanwhile, output data Dout of the embedded memory 34 is evaluated and compared by the comparator 14, and the signals Judge and Jio[i,0] are outputted to the priority axis sequencer circuit 22 at a low level when it is a "pass" and at a high level when it is a "fail".

At time t2, the signal Judge becomes high level when the address a1 is judged as a "fail." At this time, the row address overlap determining circuit 41 decides that there is no overlap since it is a first "fail," and outputs the signal Judge2 having the same phase as the signal Judge at a high level. The flip-flop circuit 42 receives the signal Judge2, latches and outputs the high level (VCC) fed to a D terminal, and makes the row redundancy confirmation signal FILL_R1 high level. Then, a row address Row_a1 latched by the primary latch circuit 21 is relatched because of the fact that the signal FILL_R1 becomes high level in the latch circuit 46, and a first redundant row is confirmed.

At time t3 when an address a3 is judged as a "fail," and the row address overlap determining circuit 41 judges that it is confirmed not to be the redundant row address which has been confirmed redundant, the row redundancy confirmation signal FILL_R2 becomes high level as in the operation at the time t2, the latch circuit 47 latches a signal Row_a3, and a second redundant row is confirmed. On the other hand, when the row address overlap determining circuit 41 judges that the address overlaps with an address that has already been confirmed to be a redundant address, the signal Judge2 remains low level and the "fail" information of the signal Judge is ignored.

At an ensuing time t4 when an address a6 is judged as a "fail," the signal FILL_R2 is at a high level and the second redundant row has already been confirmed, the signal FILL_IO1 becomes high level. Then, the latch circuit 48 latches the individual I/O comparison result signal Jio[i,0] as a confirmed redundant I/O instead of a row address.

As described above, the redundancy parameter is confirmed in the order of the first redundant row, the second redundant row, and the redundant I/O every time an address is judged as a "fail". When an address is judged as a "fail" again with the redundant I/O already confirmed, and the row address overlap determining circuit 41 judges that there is no overlap, the flip-flop circuit 45 latches a high level and outputs a high level signal FILL_ALL. The high level signal FILL_ALL means that inability to relieve failures by the redundancy means is confirmed. The signal FILL_ALL is for instance outputted to the outside of the chip and used by a tester (not shown in the drawings) to judge whether or not failures can be repaired by the redundancy means.

As described above, according to the present embodiment, redundancy replacement means is provided by having the individual I/O output Jio[i,0] as a redundancy parameter in the embedded memory having the I/Os as redundancy parameters. Further, the circuit scale of the redundant element location operator 20 can be made small by determining the priority axis according to a preset location order and corresponding to the order in which defects are detected. In the conventional example, two flip-flops for storing three failures are needed in order to decide that a redundant I/O must be used (i.e., to achieve "MUST redundant I/O", and a total of 256 flip-flops must be provided in the comparator in a structure having 128 I/Os because two flip-flops are needed to store 3 times of failure (fails) in the conventional art. However, only a total of 128 flip-flops are needed and an increase in circuit scale can be suppressed by applying the replacement means of the present embodiment in which defects are relieved in the order in which they are detected. Further, a high-speed redundancy confirmation is possible since the redundancy confirmation means is constituted by the row address overlap determining circuit constituted by a simple combinational circuit and one stage of the flip-flop circuits in the redundant element location operator 20.

Embodiment 2

Figure 5:
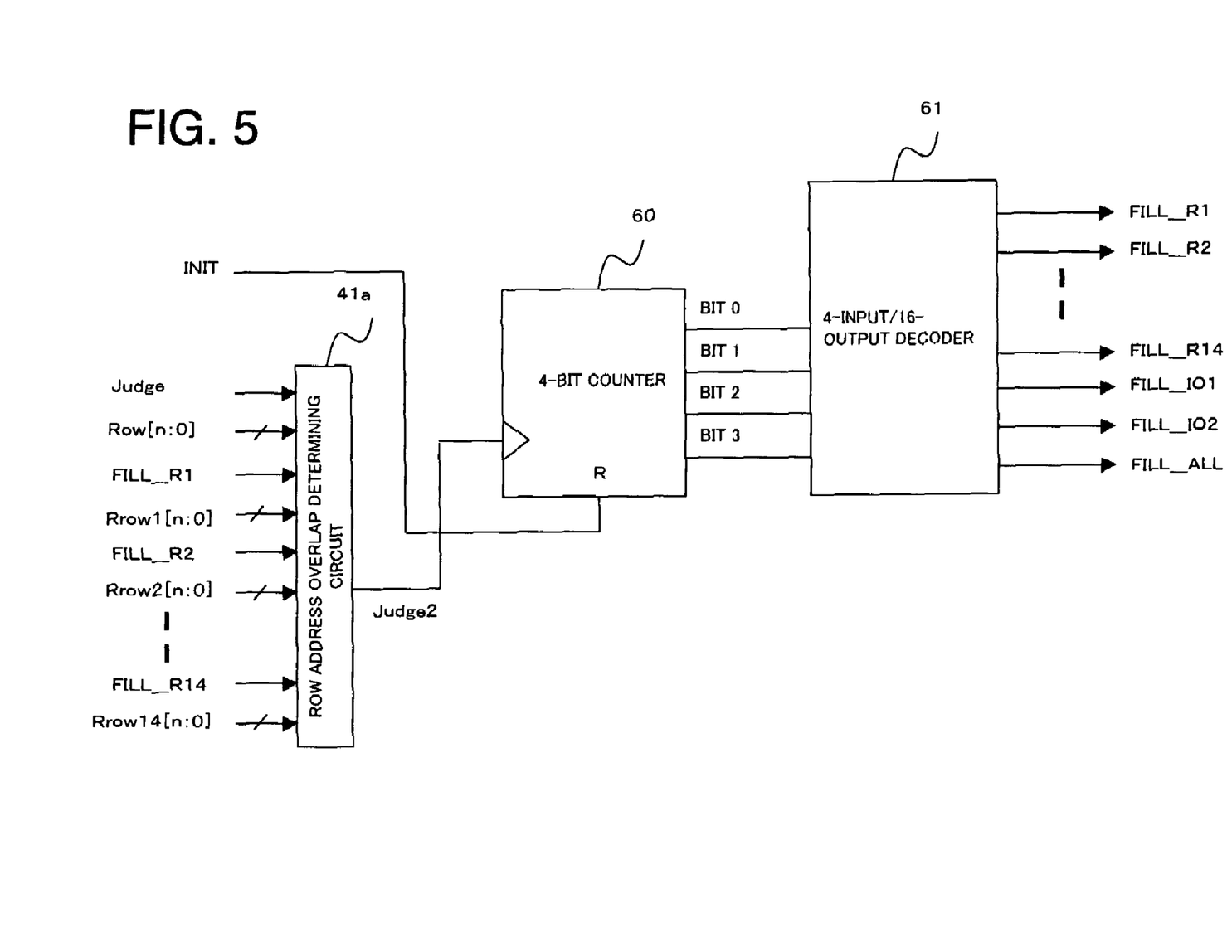
FIG. 5 is a block diagram illustrating the structure of a priority axis sequencer of a semiconductor memory device relating to a second embodiment of the present invention.

FIG. 5 is a block diagram illustrating the structure of a priority axis sequencer of a semiconductor memory device relating to a second embodiment of the present invention. The priority axis sequencer shown in FIG. 5 comprises a row address overlap determining circuit 41a, a 4-bit counter 60, and a 4-input/16-output decoder 61. Here, the priority axis sequencer 22 will be described in an example in which the numbers of the redundant rows and the redundant I/Os are 14 and 2 respectively.

The row address overlap determining circuit 41a receives the signal Judge outputted by the comparator 14 shown in FIG. 2, the signal Rrow[n,0] outputted by the primary address latch circuit 21, 14 redundancy confirmation signals FILL_R1 to FILL_R14, and 14 pairs of the address signals Rrow1[n,0] to Rrow14[n,0], and determines whether or not a failing row address has already been used as a redundant row address, i.e., whether or not the address indicated by Rrow1[n,0] to Rrow14[n,0] and the address indicated by Row[n,0] overlap. And when it determines that they don't overlap, it outputs the signal Judge2 as a clock signal to a clock input terminal of the 4-bit counter 60.

The 4-bit counter 60 is counted up by the signal Judge2 outputted by the row address overlap determining circuit 41a every time a "fail" is judged. The 4-input/16-output decoder 61 generates 16 redundancy confirmation signals FILL_R1 to FILL_R14, FILL_IO1, and FILL_IO2 by decoding outputs of the 4-bit counter 60 (bits 0 to 3).

Figure 6:
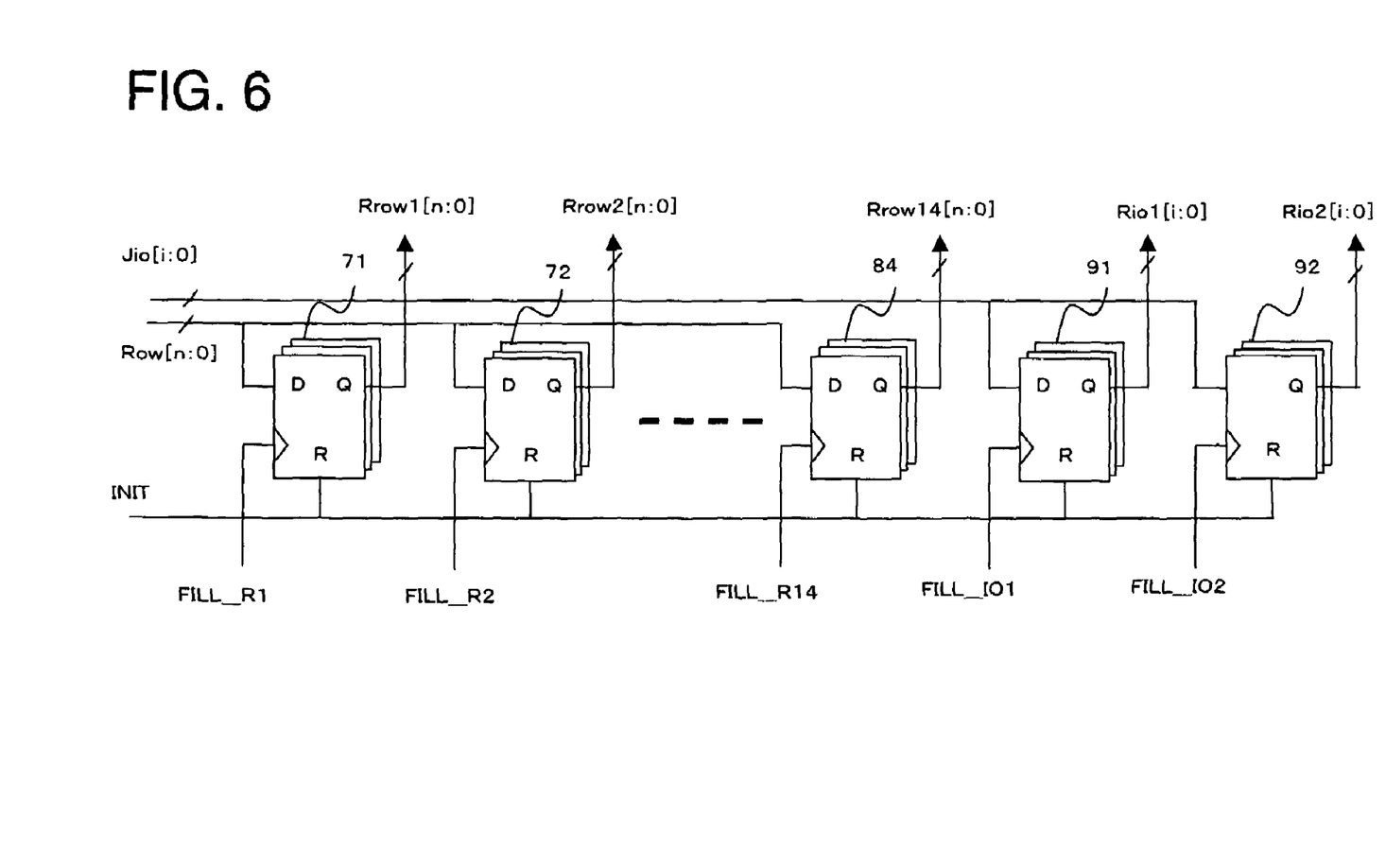
FIG. 6 is a block diagram showing an address latch unit of the priority axis sequencer relating to the second embodiment of the present invention.

FIG. 6 is a block diagram showing an address latch unit of the priority axis sequencer relating to the second embodiment. In FIG. 6, the address latch unit comprises flip-flop circuits 71 to 84, 91 and 92. Each of the flip-flop circuits 71 to 84 includes a plurality of flip-flop circuits, as many as the number of the addresses. The flip-flop circuits 71 to 84 latch the signal Rrow[n,0] when the redundancy confirmation signals FILL_R1 to FILL_R14 become high level, and respectively output the address signals Rrow1[n,0] to Rrow14[n,0]. The address signals Rrow1[n,0] to Rrow14[n, 0] are outputted to the row address overlap determining circuit 41a as well as to the shift register circuit 23.

Further, each of the flip-flop circuits 91 and 92 includes a plurality of flip-flop circuits, as many as the number of the I/Os. The flip-flop circuits 91 and 92 latch the signal Jio[i,0] when the redundancy confirmation signals FILL_IO1 and FILL_IO2 become high level, and respectively output signals Rio1[i,0] and Rio2[i,0]. The signals Rio1[i,0] and Rio2[i,0] are outputted to the row address overlap determining circuit 41a as well as to the shift register circuit 23.

The priority axis sequencer 22 shown in FIG. 2 has a small circuit scale in a small scale redundancy structure having 2 redundant rows and 1 redundant I/O. However, when the number of the redundant rows increases, so does the circuit scale. For instance, with 14 redundant rows and 2 redundant I/Os, 16 flip-flops are needed. In such a case, the increase in the circuit scale can be suppressed by constituting the priority axis sequencer with a 4-bit counter as shown in FIG. 6. An example in which the numbers of the redundant rows and the redundant I/Os are 14 and 2 respectively has been described, however, the numbers are not limited to these and similar structures can be achieved even with larger values.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory device having a row redundancy unit and an I/O redundancy unit as two dimensional redundancy units for relieving defects of an embedded memory,
    said row redundancy unit including redundant memory cell groups that replace memory cell rows addressed by row addresses, and
    said I/O redundancy unit including redundant memory cell groups that replace memory cell groups provided for every input/output data,
    wherein said memory device comprises:
    a built-in self-test circuit that tests an embedded memory,
    a redundant element location operator that selects a redundant memory cell group from said row redundancy unit and said I/O redundancy unit based on a preset order and according to the order in which defects are detected by said self-test circuit, and
    a redundancy replacement unit that replaces defects in said embedded memory with said redundant memory cell group selected by said redundant element location operator.

2. The semiconductor memory device as defined in claim 1 wherein said redundant element location operator comprises a latch circuit that stores the address of said defect replaced in said embedded memory and an address overlap determining circuit that detects a coincidence between a defect address detected by said self-test circuit and the address of said defect stored in said latch circuit, and said latch circuit latches said defect address detected when no coincidence is detected.

3. The semiconductor memory device as defined in claim 2 wherein said redundant element location operator further comprises a shift register circuit that shifts a predetermined signal and outputs a pulse signal for said latch circuit to latch said defect address every time said coincidence detection indicates that there is no overlap.

4. The semiconductor memory device as defined in claim 2 wherein said redundant element location operator comprises a counter circuit that counts the number of times that said coincidence detection indicates that there is no overlap, and a decoder circuit that receives and decodes outputs as many as the number of bits of said counter circuit and outputs a pulse signal for said latch circuit to latch said defect address.

* * * * *